US012580544B2

(12) United States Patent　　(10) Patent No.: US 12,580,544 B2
Nielsen　　　　　　　　　　　　　(45) Date of Patent: Mar. 17, 2026

(54) PHASE NOISE REDUCTION IN A VARIABLE ANALOGUE RF RESONATOR WITH SWITCHED CAPACITORS

(71) Applicant: Anlotek Limited, London (GB)

(72) Inventor: Jorgen Staal Nielsen, Calgary (CA)

(73) Assignee: Anlotek Limited, London (GB)

( * ) Notice: Subject to any disclaimer, the term of this patent is extended or adjusted under 35 U.S.C. 154(b) by 837 days.

(21) Appl. No.: 17/733,936

(22) Filed: Apr. 29, 2022

(65) Prior Publication Data

US 2022/0376670 A1　　Nov. 24, 2022

Related U.S. Application Data

(60) Provisional application No. 63/182,650, filed on Apr. 30, 2021.

(51) Int. Cl.
　　*H03H 7/00*　　　(2006.01)
　　*H03H 11/12*　　(2006.01)
(52) U.S. Cl.
　　CPC .......... *H03H 7/00* (2013.01); *H03H 11/1208* (2013.01); *H03H 11/1291* (2013.01)
(58) Field of Classification Search
　　CPC .. H03H 7/00; H03H 11/1208; H03H 11/1291; H03H 2210/015; H03H 2210/025; H03H 2210/033; H03H 2210/036; H03B 2201/0208; H03B 2201/025; H03B 5/08
　　See application file for complete search history.

(56) References Cited

U.S. PATENT DOCUMENTS

| | | | |
|---|---|---|---|
| 1,570,771 A | 1/1926 | Nyquist | |
| 1,778,085 A | 10/1930 | Nyquist | |
| 1,915,440 A | 6/1933 | Nyquist | |
| 1,926,169 A | 9/1933 | Nyquist | |
| 2,099,769 A | 11/1937 | Nyquist | |
| 3,720,881 A | 3/1973 | Hurtig, III | |

(Continued)

FOREIGN PATENT DOCUMENTS

| | | |
|---|---|---|
| CN | 102098018 A | 6/2011 |
| CN | 104538714 A | 4/2015 |

(Continued)

OTHER PUBLICATIONS

Anis, M., et al., "Fully Integrated Super-Regenerative Bandpass Filters for 3.1-to-7GHz Multiband UWB System," Proceedings of the IEEE International Symposium on VLSI Design, Automation and Test (VLSI-DAT), Apr. 23-25, 2008, Hsinchu, Taiwan, 4 pages.

(Continued)

*Primary Examiner* — Andrea Lindgren Baltzell
*Assistant Examiner* — Kimberly E Glenn
(74) *Attorney, Agent, or Firm* — CHRISTENSEN O'CONNOR JOHNSON KINDNESS PLLC

(57)　　ABSTRACT

An active feedback RF resonator has a signal loop having a signal input and a signal output. The signal loop has a variable gain stage and at least one variable resonator, each variable resonator comprising an inductance element and a variable capacitance element comprising a number of switched fixed value capacitors and a variable capacitor. A phase noise of the active feedback RF signal has a maximum value for an operating frequency of the variable resonator that is based on an operating range of the variable capacitor.

12 Claims, 4 Drawing Sheets

(56) References Cited

U.S. PATENT DOCUMENTS

| | | | |
|---|---|---|---|
| 5,220,686 | A | 6/1993 | Kasperkovitz et al. |
| 5,291,159 | A | 3/1994 | Vale |
| 5,311,198 | A | 5/1994 | Sutton |
| 5,854,593 | A | 12/1998 | Dykema et al. |
| 5,917,387 | A | 6/1999 | Rice et al. |
| 5,949,290 | A | 9/1999 | Bertram |
| 6,057,735 | A | 5/2000 | Cloutier |
| 6,236,281 | B1 | 5/2001 | Nguyen et al. |
| 6,420,913 | B1 | 7/2002 | Freeman |
| 6,452,465 | B1 | 9/2002 | Brown et al. |
| 6,496,075 | B2 | 12/2002 | Justice et al. |
| 6,587,007 | B2 | 7/2003 | Exeter |
| 6,650,195 | B1 | 11/2003 | Brunn et al. |
| 6,771,147 | B2 | 8/2004 | Mongia |
| 6,865,387 | B2 | 3/2005 | Bucknell et al. |
| 6,898,450 | B2 | 5/2005 | Eden et al. |
| 6,920,315 | B1 | 7/2005 | Wilcox et al. |
| 6,937,877 | B2 | 8/2005 | Davenport |
| 6,941,118 | B2 | 9/2005 | Yamamoto |
| 6,954,774 | B1 | 10/2005 | Mulbrook |
| 7,098,751 | B1 | 8/2006 | Wong |
| 7,151,925 | B2 | 12/2006 | Ting et al. |
| 7,158,010 | B2 | 1/2007 | Fischer et al. |
| 7,174,147 | B2 | 2/2007 | Toncich et al. |
| 7,346,330 | B2 | 3/2008 | Kawabe et al. |
| 7,400,203 | B2 | 7/2008 | Ojo et al. |
| 7,414,779 | B2 | 8/2008 | Huber et al. |
| 7,423,502 | B2 | 9/2008 | Razafimandimby et al. |
| 7,433,668 | B2 | 10/2008 | Fischer et al. |
| 7,509,141 | B1 | 3/2009 | Koenck et al. |
| 7,518,458 | B2* | 4/2009 | Nakamura ........... H03B 5/1228 |
| | | | 331/177 V |
| 7,522,016 | B2 | 4/2009 | Toncich et al. |
| 7,809,410 | B2 | 10/2010 | Palum et al. |
| 7,917,117 | B2 | 3/2011 | Zafonte |
| 7,937,076 | B2 | 5/2011 | Zeller et al. |
| 8,000,379 | B2 | 8/2011 | Kishigami et al. |
| 8,050,708 | B2 | 11/2011 | March et al. |
| 8,103,213 | B2 | 1/2012 | Tolonen |
| 8,106,727 | B2 | 1/2012 | Kawai et al. |
| 8,107,939 | B2 | 1/2012 | Hassan et al. |
| 8,120,536 | B2 | 2/2012 | Lindmark |
| 8,140,033 | B2 | 3/2012 | Chan Wai Po et al. |
| 8,253,514 | B2 | 8/2012 | Kharrat et al. |
| 8,294,537 | B2 | 10/2012 | Kawai et al. |
| 8,565,671 | B2 | 10/2013 | Robert et al. |
| 8,767,871 | B2 | 7/2014 | Park et al. |
| 8,922,294 | B2 | 12/2014 | Tsuzuki et al. |
| 8,981,875 | B2 | 3/2015 | Park |
| 9,024,709 | B2 | 5/2015 | Joshi et al. |
| 9,083,351 | B1 | 7/2015 | Lee et al. |
| 9,129,080 | B2 | 9/2015 | Tsuzuki et al. |
| 9,184,498 | B2 | 11/2015 | Schiller |
| 9,231,712 | B2 | 1/2016 | Hahn et al. |
| 9,407,239 | B2 | 8/2016 | White et al. |
| 9,634,390 | B2 | 4/2017 | Onaka |
| 9,641,138 | B2 | 5/2017 | Zhu |
| 9,698,747 | B2 | 7/2017 | Ishizuka |
| 10,050,604 | B2 | 8/2018 | Nielsen et al. |
| 10,228,927 | B2 | 3/2019 | Choi et al. |
| 10,236,899 | B1 | 3/2019 | Tope et al. |
| 10,396,807 | B1 | 8/2019 | Dai et al. |
| 11,290,084 | B2 | 3/2022 | Nielsen et al. |
| 2001/0043116 | A1 | 11/2001 | Waltman |
| 2004/0030108 | A1 | 2/2004 | Pihlava et al. |
| 2005/0003785 | A1 | 1/2005 | Jackson et al. |
| 2007/0010217 | A1 | 1/2007 | Takahashi et al. |
| 2007/0195915 | A1 | 8/2007 | Ko et al. |
| 2007/0296513 | A1 | 12/2007 | Ruile et al. |
| 2009/0322445 | A1 | 12/2009 | Raidl et al. |
| 2010/0097152 | A1 | 4/2010 | Wang et al. |
| 2010/0141355 | A1 | 6/2010 | Kharrat et al. |
| 2011/0002080 | A1 | 1/2011 | Ranta |
| 2011/0187448 | A1 | 8/2011 | Koechlin |
| 2013/0065542 | A1 | 3/2013 | Proudkii |
| 2013/0142089 | A1 | 6/2013 | Azarnaminy et al. |
| 2013/0293291 | A1 | 11/2013 | Shanan |
| 2014/0266454 | A1 | 9/2014 | Testi et al. |
| 2014/0361839 | A1 | 12/2014 | Scott et al. |
| 2016/0072442 | A1 | 3/2016 | Testi et al. |
| 2016/0164481 | A1 | 6/2016 | Madan et al. |
| 2017/0149411 | A1* | 5/2017 | Nielsen .............. H03H 11/1208 |
| 2020/0014382 | A1 | 1/2020 | Ranta |
| 2021/0067125 | A1 | 3/2021 | Nielsen |

FOREIGN PATENT DOCUMENTS

| | | | |
|---|---|---|---|
| CN | 108463949 | B | 7/2022 |
| EP | 1675263 | A1 | 6/2006 |
| EP | 3062442 | A1 | 8/2016 |
| GB | 2 403 086 | A | 12/2004 |
| GB | 2 478 585 | A | 9/2011 |
| GB | 2 494 652 | A | 3/2013 |
| WO | 01/89081 | A2 | 11/2001 |
| WO | 02/087071 | A2 | 10/2002 |
| WO | 2009114123 | A2 | 9/2009 |
| WO | 2011/103108 | A1 | 8/2011 |
| WO | 2015/176041 | A1 | 11/2015 |

OTHER PUBLICATIONS

Anis, M., et al., "Low Power Complementary-Colpitts Self-Quenched Super-Regenerative Ultra-Wideband (UWB) Bandpass Filter in CMOS Technology," Proceedings of the IEEE MTT-S International Microwave Symposium Digest, Jun. 15-20, 2008, Atlanta, pp. 1047-1049.

Bahl, I.J., "High-Performance Inductors," IEEE Transactions on Microwave Theory and Techniques 49(4):654-664, Apr. 2001.

Bhattacharya, A., et al., "A 1.3-2.4-GHz 3.1-mW VCO Using Electro-Thermo-Mechanically Tunable Self-Assembled MEMS Inductor on HR Substrate," IEEE Transactions on Microwave Theory and Techniques 63(2):459-469, Feb. 2015.

Chen, J.-Y., et al., "A Fully Integrated Auto-Calibrated Super-Regenerative Receiver in 0.13-μm CMOS," IEEE Journal of Solid-State Circuits 42(9):1976-1985, Sep. 2007.

Chen, Y.-M., et al., "A 1-1.5 GHZ Broadband Tunable Bandpass Filter," Proceedings of the Asia-Pacific Microwave Conference (APMC), Kaohsiung, Taiwan, Dec. 4-7, 2012, pp. 738-740.

Duncan, R., et al., "A Q-Enhanced Active-RLC Bandpass Filter," IEEE Transactions on Circuits and Systems—II: Analog and Digital Signal Processing 44(5):341-347, May 1997.

Entesari, K., et al., "A 25-75-MHz RF MEMS Tunable Filter," IEEE Transactions on Microwave Theory and Techniques 55(11):2399-2405, Nov. 2007.

Frey, D.R., "Improved Super-Regenerative Receiver Theory," IEEE Transactions on Circuits and Systems—I: Regular Papers 60(12):3267-3278, Dec. 2013.

Georgescu, B., et al., "Tunable Coupled Inductor Q-Enhancement for Parallel Resonant LC Tanks," IEEE Transactions on Circuits and Systems—II: Analog and Digital Signal Processing 50(10):705-713, Oct. 2003.

Golaszewski, A., and A. Abramowicz, "Voltage Tunable Bandpass Filter," Proceedings of the Signal Processing Symposium (SPSympo), Debe, Poland, Jun. 10-12, 2015, 4 pages.

Guyette, A.C., "Alternative Architectures for Narrowband Varactor-Tuned Bandpass Filters," Proceedings of the European Microwave Conference (EuMC), Rome, Sep. 29-Oct. 1, 2009, pp. 1828-1831.

He, X., and W.B. Kuhn, "A Fully Integrated Q-Enhanced LC Filter With 6 dB Noise Figure at 2.5 GHz in SOI," Proceedings of the IEEE Radio Frequency Integrated Circuits (RFIC) Symposium, Fort Worth, Texas, Jun. 6-8, 2004, pp. 643-646.

International Search Report and Written Opinion mailed Feb. 8, 2017, issued in corresponding International Application No. PCT/GB2016/053686, filed Nov. 23, 2016, 10 pages.

Kuhn, W.B., et al., "Q-Enhanced LC Bandpass Filters for Integrated Wireless Applications," IEEE Transactions on Microwave Theory and Techniques 46(12):2577-2586, Dec. 1998.

(56)  References Cited

OTHER PUBLICATIONS

Luo, X., et al., "Tunable Bandpass Filter With Two Adjustable Transmission Poles and Compensable Coupling," IEEE Transactions on Microwave Theory and Techniques 62(9):2003-2013, Sep. 2014.

Nosrati, M., and Z. Atlasbaf, "A New Miniaturized Electronically Tunable Bandpass Filter," Proceedings of the Seventh International Symposium on Antennas, Propagation & EM Theory (ISAPE '06), Guilin, China, Oct. 26-29, 2007, 5 pages.

Piazza, G., "MEMS Resonators for Frequency Control and Sensing Applications," presentation, University of Pennsylvania, Philadelphia [at least as early as Apr. 24, 2015], 104 pages.

Psychogiou, D., et al., "V-Band Bandpass Filter With Continuously Variable Centre Frequency," IET Microwaves, Antennas & Propagation 7(8):701-707, Jun. 2013.

Quednau, P., et al., "A Small Size Low Cost Electronically Tunable Bandpass Filter With Integrated Bias Control," Proceedings of the IEEE International Conference on Microwaves, Communications, Antennas and Electronic Systems (COMCAS), Tel Aviv, Israel, Oct. 21-23, 2013, 4 pages.

Ramadan, A.H., et al., "A Narrowband Frequency-Tunable Antenna for Cognitive Radio Applications," Proceedings of the Sixth European Conference on Antennas and Propagation (EuCAP), Mar. 26-30, 2012, Prague, 5 pages.

Ramadan, A.H., et al., "A Tunable Filtenna for Cognitive Radio Applications," Proceedings of the Ninth European Conference on Antennas and Propagation (EuCAP), Apr. 13-17, 2015, Lisbon, Portugal, 2 pages.

Soorapanth, T., and S.S. Wong, "A 0-dB IL 2140 ± 30 MHz Bandpass Filter Utilizing Q-Enhanced Spiral Inductors in Standard CMOS," IEEE Journal of Solid-State Circuits 37(5):579-586, May 2002.

Sunca, A., et al., "A Wide Tunable Bandpass Filter Design Based on CMOS Active Inductor," Proceedings of the Eighth Conference on Ph.D. Research in Microelectronics and Electronics (PRIME), Session TF3—Microwave and RF, Aachen, Germany, Jun. 12-15, 2012, pp. 203-206.

Wang, S., and R.-X. Wang, "A Tunable Bandpass Filter Using Q-Enhanced and Semi-Passive Inductors at S-Band in 0.18-μM CMOS," Progress in Electromagnetics Research B 28:55-73, 2011.

Written Opinion of the International Preliminary Examining Authority mailed on Feb. 5, 2018, issued in corresponding International Application No. PCT/GB2016/053686, filed Nov. 23, 2016, 6 pages.

He, X., and W.B. Kuhn, "A 2.5-GHz Low-Power, High Dynamic Range, Self-Tuned Q-Enhanced LC Filter in SOI," ieee Journal of Solid-State Circuits, vol. 40, No. 8, Aug. 2005, 1618-1628.

Gao, W. and W.S. Snelgrove, "A 950MHz Second-Order Integrated LC Bandpass Modulator" 1997 Symposium on VLSI Circuits Digest of Technical Papers, pp. 111-112.

Zumbahlen, Hank: "Chapter 5: Analog Filters ; Section 5-6: Filter Realizations" In: "Op Amp Applications Handbook". Dec. 31, 2005, Newnes, Oxford, p. 5.59-5.100.

Deliyannis, Theodore L, et al.: "5.6 Multiple-Loop Feedback Filters" In: "Continuous-Time Active Filter Design." Jan. 1, 1999, Boca Raton, FL: CRC Press, US 028016, pp. 162-171.

* cited by examiner

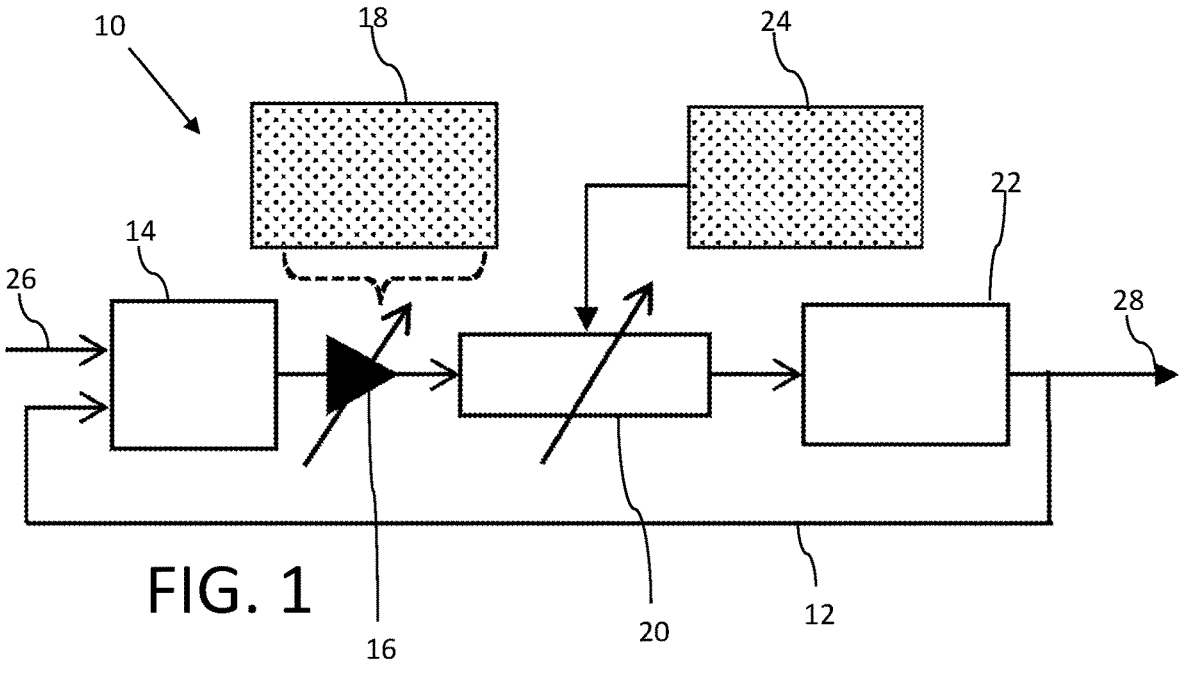
FIG. 1
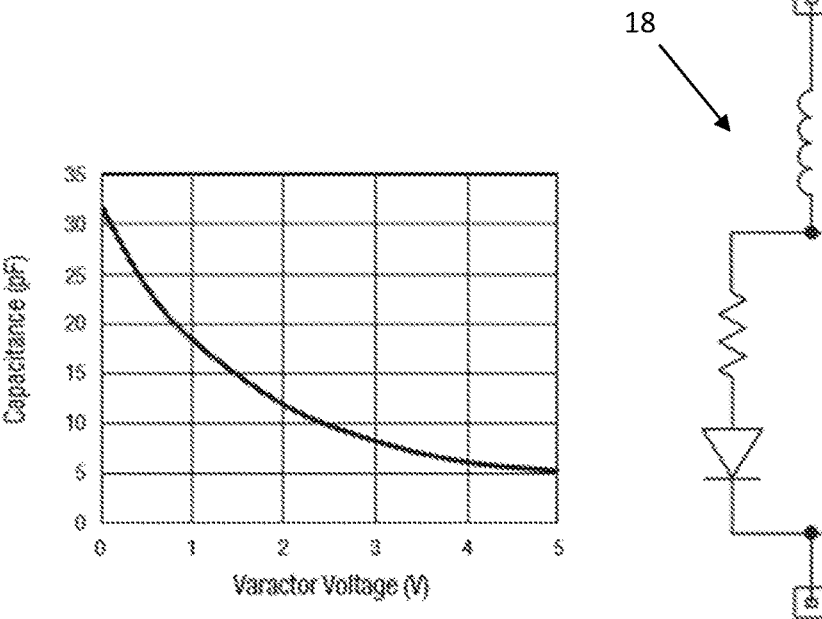
FIG. 2a
FIG. 2b

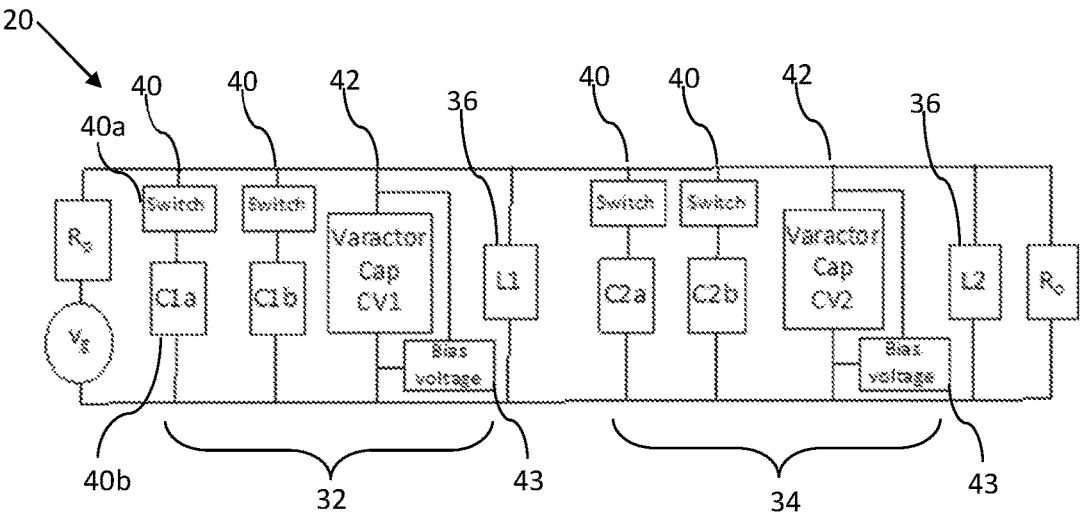
FIG. 3
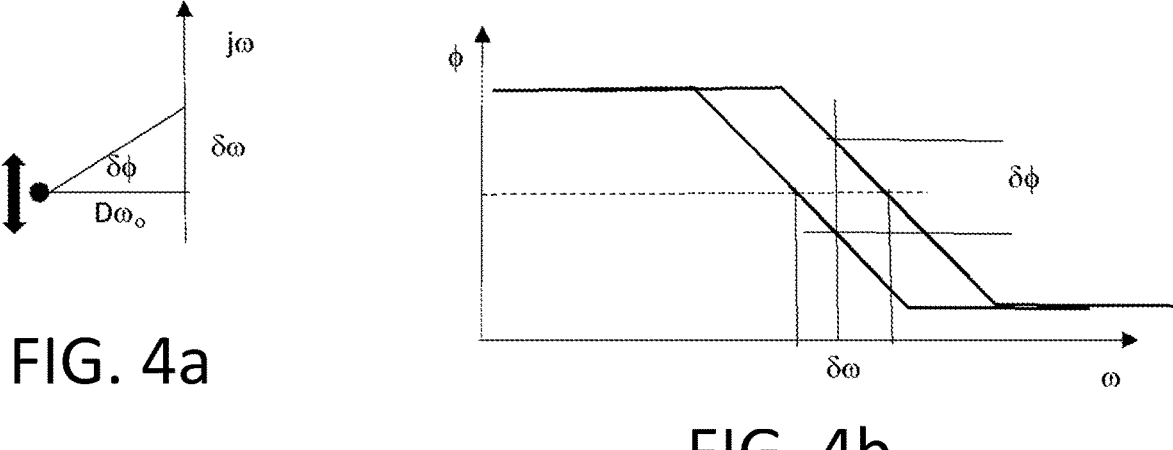
FIG. 4a
FIG. 4b

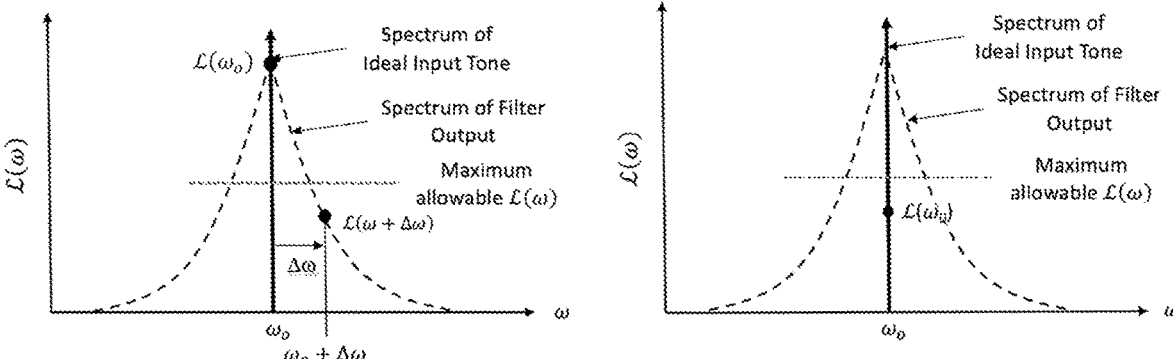
FIG. 7a                    FIG. 7b
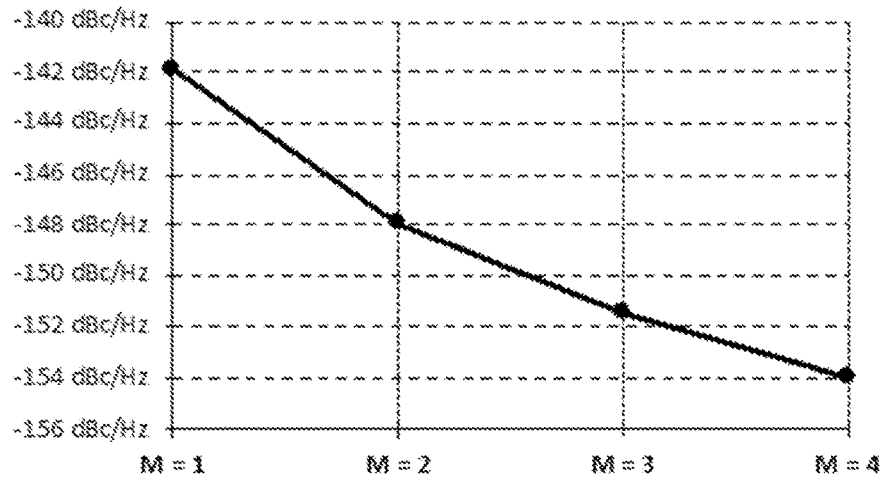
FIG. 8

PHASE NOISE REDUCTION IN A VARIABLE ANALOGUE RF RESONATOR WITH SWITCHED CAPACITORS

TECHNICAL FIELD

This relates to tuning a variable active feedback RF resonator, such as a tunable RF filter or oscillator, and in particular, tuning the active feedback RF resonator using switched capacitor circuits.

BACKGROUND

Active feedback resonators may be used as a component of a bandpass filters (BPF) commonly used in signal processing for various purposes. A BPF generally involves some form of resonator that stores energy in a given frequency band. U.S. Pat. No. 10,050,604 B2 (Nielsen et al.) entitled "Variable Filter" (herein "Nielsen patent") is an example of a variable filter with an active feedback resonator that is tuned for the independent variables of center frequency and bandwidth Q of the resonator.

Resonators are implemented as a circuit whose operating point is in the left hand side of the complex s plane. Oscillators are similar circuits with an operating point in the right hand side of the s plane. Both resonator and oscillator circuits can display phase noise that may be detrimental to intended circuit operation.

SUMMARY

According to an aspect, there is provided an active feedback RF resonator, comprising a signal loop having a signal input and a signal output, the signal loop comprising a variable gain stage and at least one variable resonator, each variable resonator comprising an inductance element and a variable capacitance element comprising a number of switched fixed value capacitors and a variable capacitor. The phase noise of the active feedback RF signal has a maximum threshold for an operating frequency of the variable resonator that is defined by the number of switched fixed value capacitors in the variable capacitance element, and/or an operating range of the variable capacitor.

According to other aspects, the variable capacitor may be a varactor, the active feedback RF resonator may be operated as an RF filter or RF oscillator, and/or the phase noise may be described by a relationship:

$$\mathcal{L}(\Delta\omega) \approx Q^2 \left(\frac{r}{2^M}\right)^2 S_{Vb}(\Delta\omega)$$

where $\Delta\omega$ is a frequency offset from the operating frequency $\omega_0$, $\mathcal{L}(\Delta\omega)$ is the phase noise at $\Delta\omega$, Q is an operating Q of the variable resonator, r is a normalized rate of change of variable capacitance relative to an operating control variable (such as the bias voltage of a varactor), M is the number of switched fixed value capacitors, and $S_{Vb}(\Delta\omega)$ is a power spectral density of the phase noise at the operating frequency plus $\Delta\omega$.

According to an aspect, there is provided a method of designing an active feedback RF resonator, comprising the steps of: providing a signal loop having a signal input and a signal output, the signal loop comprising a variable gain stage and at least one variable resonator, each variable resonator comprising an inductance element and a variable capacitance element comprising a number of switched capacitors and a variable capacitor, the switched capacitors having fixed capacitance values. For each variable resonator: calculating an operating factor based on one or more of the following parameters of the variable resonator: a minimum Q, a maximum phase noise factor, a range of operating frequencies, and an operating bias voltage and capacitance of the variable capacitor; and calculating the number of switched capacitors based on a logarithm of the operating factor.

According to other aspects, the variable capacitor may be a varactor, the active feedback RF resonator may be operated as an RF filter or RF resonator, and/or the operating factor may be proportional to $$Qr\sqrt{\frac{S_{Vb}(\Delta\omega)}{\mathcal{L}(\Delta\omega)}},$$

where $(\Delta\omega)$ is a frequency offset from the operating frequency, $\mathcal{L}(\Delta\omega)$ is the phase noise at $\Delta\omega$, Q is an operating Q of the variable resonator, r is a normalized rate of change of capacitance relative to a change in the operating bias voltage of the variable capacitor, and $S_{Vb}(\Delta\omega)$ is a power spectral density of the phase noise at $\Delta\omega$.

According to an aspect, there is provided a method of designing an active feedback RF resonator, comprising the step of: providing a signal loop having a signal input and a signal output, the signal loop comprising a variable gain stage and at least one variable resonator, each variable resonator comprising an inductance element and a variable capacitance element comprising a number of switched capacitors and a variable capacitor, the switched capacitors having fixed capacitance values, and wherein the variable capacitor comprises 40% or less of a total capacitance of the variable capacitance element, or 20% or less of the total capacitance.

According to other aspects, the variable capacitor may be a varactor, and/or the phase noise may be described by a relationship:

$$\mathcal{L}(\Delta\omega) \approx Q^2 \left(\frac{r}{2^M}\right)^2 S_{Vb}(\Delta\omega)$$

where $\Delta\omega$ is a frequency offset from the operating frequency $\omega_0$, $\mathcal{L}(\Delta\omega)$ is the phase noise at $\Delta\omega$, Q is an operating Q of the variable resonator, r is a normalized rate of change of variable capacitance relative to an operating bias voltage of the varactor, M is the number of switched fixed value capacitors, and $S_{Vb}(\Delta\omega)$ is a power spectral density of the phase noise at the operating frequency plus $\Delta\omega$. According to an aspect, the phase noise in a variable active feedback RF filter is reduced, such as by several orders of magnitude, by combining switched fixed value capacitor bank(s) with a tunable capacitor element, such as a varactor. This may involve appropriate design trade-offs to achieve a desired tuning range of the resonator. In a further aspect, the variable RF filter is designed to account for the accumulation of phase noise from multiple RF filters or resonators within each RF filter in a multipole filter.

According to an aspect, the key component of phase noise is related to the term $(Qr)^2$, where Q describes the bandwidth of the resonator and r is a measure of the change in variable capacitance versus the control variable, which in the case of a varactor, is the bias voltage of the variable capacitor.

According to an aspect, one or more switched fixed capacitor banks may be used to reduce the phase noise component of a variable RF resonator filter circuit and may be used to extend the tuning range of the RF filter.

In other aspects, the features described above may be combined together in any reasonable combination as will be recognized by those skilled in the art.

BRIEF DESCRIPTION OF THE DRAWINGS

These and other features will become more apparent from the following description in which reference is made to the appended drawings, the drawings are for the purpose of illustration only and are not intended to be in any way limiting, wherein:

FIG. 1 is a bock diagram of a single pole RF filter.

FIG. 2a is a plot of a typical non-linear capacitance vs. varactor voltage.

FIG. 2b is a schematic diagram of a representative bias voltage circuit.

FIG. 3 is a block diagram of a two resonator RF filter with each resonator composed of a fixed inductor and both variable and switched fixed capacitors.

FIG. 4a is a plot showing dominant pole modulation of the two resonator RF filter of FIG. 3.

FIG. 4b is a plot showing the throughput phase of the two resonator RF filter of FIG. 3.

FIG. 7a is a plot showing initial state and desired phase noise.

FIG. 7b is a plot showing final state operating at reduced phase noise.

FIG. 8 is a plot showing phase noise from varactor bias voltage versus the number of switchable fixed capacitors M for a fixed resonator Q=1000.

DETAILED DESCRIPTION OF PREFERRED EMBODIMENTS

There will now be described an active feedback variable RF resonator. Such an RF resonator typically includes a signal loop with a variable gain block and a resonator that may be based on passive components. It will be understood that, while the discussion below is primarily in the context of active feedback variable RF filters, such as RF filter 10 shown in FIG. 1, the principles described herein may apply to other types of active feedback RF resonators that are affected by similar types of phase noise, including active feedback variable RF oscillators.

Variable RF Filter Overview

Figure 5:
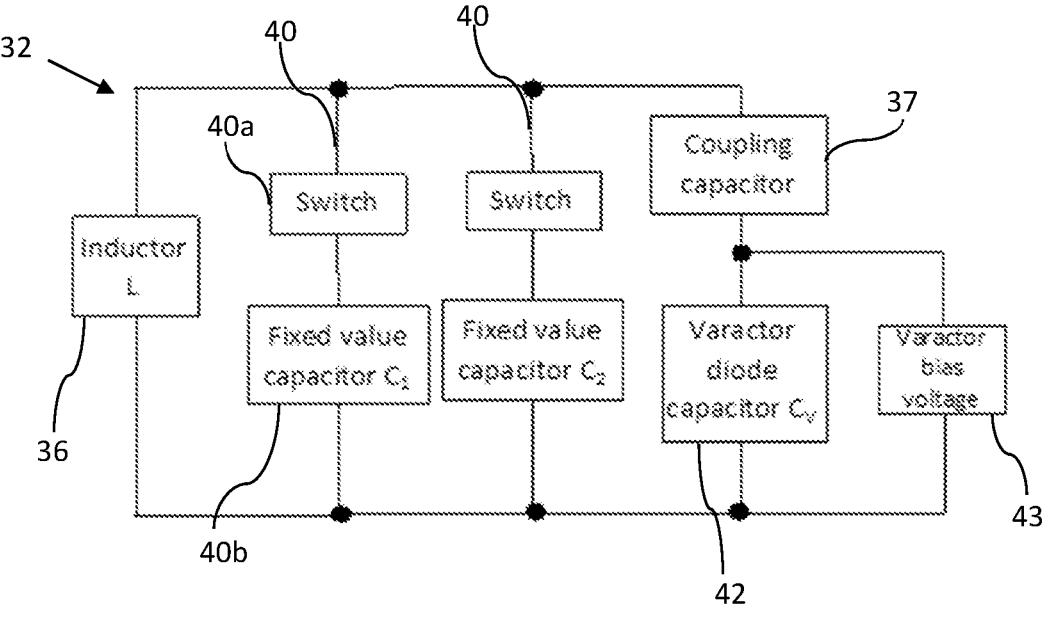
FIG. 5 is a block diagram of a resonator with two switched capacitor elements in parallel and M=2.

Referring to FIG. 1, variable RF filter 10 has an active feedback loop 12 with a sum block 14, gain block 16 with variable gain control 18, a tunable resonator 20, a fixed delay represented by block 22, a signal input 26, and a signal output 28. Other components may be included, and the placement of components in signal loop 12, such as gain block 16, may be varied. Tunable resonator 20 may be implemented with multiple switched capacitors, such as a resonator tank circuit 32 as shown in FIG. 5. Resonator tank circuit 32 has a bank of switched capacitors 40 made up of switches 40a and capacitive elements $C_r$ 40b, in combination with a variable capacitor element 42 whose capacitance is changed via a bias voltage source 43, that allows for more continuous capacitance between the values achievable by the switched capacitors 40b. Resonator tank circuit 42 as depicted also includes an inductor 36 and a coupling capacitor 37. Coupling capacitor 37 may be part of the tuning capacitance of the resonator. Variable capacitor element 42 may be a varactor that is connected to a varactor bias 24. Other types of variable capacitors connected to a control variable may also be used, and similar considerations to those discussed below apply. For simplicity, the discussion below will be primarily in the context of a varactor.

The single sideband power spectral density of the phase noise $\mathcal{L}(\omega)$ of the variable RF filter will now be considered. Not considered in this phase noise analysis are:

Amplitude noise, as this may be normalized by a limiter.

Intermodulation distortion of the variable RF filter, as the input signal amplitude may be assumed sufficiently small that nonlinear distortion is negligible.

For some applications, such as where the objective is to implement the variable RF filter to isolate a single tone of a Direct Digital Synthesis (DDS) output, a single pole variable RF filter may be used.

The phase noise of a single pole RF filter will be considered first, and the phase noise of a multipole RF filter will be considered later.

Seen in FIG. 1 are examples of sources of phase noise in RF filter 10, which are each active elements to be evaluated:

1. The variable gain block 16, and
2. The varactor bias 24 voltage applied to tunable resonator 20.

As an example, assumptions may be given as:

Output signal power of the RF filter is a nominal 0 dBm

Enhanced Q is 1000

Resonator Q is on the order of 20

Given these assumptions, the Q enhancement factor is $Q_{enh}$=1000/20=50. In this example, the RF filter will thus have a signal power gain of 20 log($Q_{enh}$)=34 dB. The signal gain is fundamental to the Q enhancement. Hence the input signal level will nominally be around −34 dBm for the nominal 0 dBm output power.

RF Filter Gain Block Phase Noise Contribution

Gain block 16 may be selected such that it contributes additive noise that is spectrally white, such as a low noise amplifier, relative to the narrow bandwidth of the RF filter. In this example, the varactor bias control 24 may contribute more significant noise as this is a direct modulation of the varactor capacitance. As the RF filter 10 is assumed to be linear, and the phase noise contributions are small, the overall phase noise may be approximated by linear superposition of the phase noise from these component sources.

The additive noise contribution resulting from gain block 16 within the closed loop 12 can be quantified, based on an equivalent noise source added at input 26 of the loop. The spectral power of this noise source is developed starting with the noise figure (NF) of the gain block which for a typical realization may be around −170 dBm/Hz. The +34 dB impact of the Q enhancement loop is then included, as well as a −3 dB factor, as the assumed limiter ideally removes the amplitude variations which should not be included as part of $\mathcal{L}(\omega)$.

Based on the above, the single sideband phase noise power density may be assessed as (ω) in the neighbourhood of −170+34−3=−139 dBc/Hz.

Varactor Phase Noise Contribution

Referring to FIG. 1, where gain control block 18 includes a varactor, the representative capacitance versus bias voltage may be as shown in FIG. 2a, where variable gain control 18 is an active bias voltage circuit, a representative example of which is shown in FIG. 2b.

The phase noise contribution of the varactor in resonator 20 is a bit more complex to consider. As an example, start with resonator 20 of the RF filter that consists of coupled first and second parallel resonator tanks 32 and 34 as shown in FIG. 3. This provides superior stability at high Q enhancement levels as may be required for narrow bandwidth applications. Resonator tanks 32 and 34 each have fixed switched capacitors 40b, and CVn are the varactor tunable capacitors 42, that combined shift the center frequency of each resonator tank. In some examples, fixed switched capacitors 40b may have the same or different capacitance values. Variable tunable capacitors 42 may be selected to have a range that corresponds to stepped values of fixed switch capacitors 40b. Variable tunable capacitors 42 may be capable of a wider tuning range, but may be limited to a specific range, such as by a controller (not shown) that is programmed to operate within a predetermined range. This range may be selected based on the operating characteristics, such as signal quality and linearity, of a given variable capacitor.

Q enhancement results in the poles of the two tank resonators 32 and 34 coupling into a single dominant pole with active feedback. This dominant pole is illustrated in FIG. 4a where $\omega_0$ is the Q enhanced resonance frequency and D is the damping coefficient such that the enhanced Q is ½D. The resonator capacitance can vary in time due to deliberate tuning in addition to small fluctuations resulting from varactor bias noise. FIG. 4a illustrates this variation as a small pole movement along the $j\omega$ axis. For a given frequency this then maps into a variation in phase shift through the resonator as a source of phase noise.

This is further illustrated in FIG. 4b showing the phase variation at a mid-band frequency. The two shown responses for phase versus frequency illustrates the variation with the fluctuation of the pole position due to issues such as varactor bias noise of the resonator. The resulting excursion of the phase due to these fluctuations thus maps into phase noise.

The Q enhanced RF filter has a dominant Q enhanced pole in FIG. 4a located in the s-plane at $$-D\omega_0 + j\omega_0 \sqrt{1-D^2}$$

where D is the damping coefficient and $\omega_0$ is the natural resonance frequency of the single dominant pole.

The enhanced Q is given as $$Q = \frac{1}{2D}$$

In a typical chip integrated circuit, a resonator Q may be around 15 to 20. However, with Q enhancement, the Q becomes large, Q>>1 such that D<<1. Thus the Q enhanced dominant pole location in the s plane may be approximated as $$-\frac{1}{2Q}\omega_0 + j\omega_0$$

Hence the pole has an approximate location along $j\omega$ axis at $j\omega_0$ and is a distance from the $j\omega$ axis as ½Q into the left-hand side of the s-plane as shown in FIG. 4a.

Initially consider that tunable capacitors 42 of FIG. 3 are varactors with a nominal value of $C_o$ at midrange and that the center frequency of the RF filter is given approximately as $$\omega_o \approx k \frac{1}{\sqrt{C_o}}$$

where k is a constant related to the resonator inductor value. Let $C = C_o + \Delta C$ to denote the equivalent single resonator capacitor.

The approximate sensitivity of resonant frequency with change in $\Delta C$ is given as $$\Delta \omega_0 \approx -(k)\frac{1}{\sqrt{C_o}}\frac{1}{2}\frac{\Delta C}{C_o}.$$

As an example, for a 20 percent relative tuning range:

$$0.2 = \frac{k\frac{1}{\sqrt{C_o}}\frac{1}{2}\frac{\Delta C}{C_o}}{k\frac{1}{\sqrt{C_o}}} = \frac{1}{2}\frac{\Delta C}{C_o}$$

so that the relative change $\Delta C/C_0$ in tunable capacitors 42 required is 40 percent for the 20 percent relative tuning range. Since tunable capacitors have values in the picofarad range, a large resonator tuning range cannot be achieved without additional switched capacitors, as will be addressed below.

In another example, varactor 42 may be designed such that less than 20%, for example 10% or less, of the intended tuning range may be achievable by a variable capacitor, such as a varactor, with the switched capacitors providing access to the remainder of the tuning range. In this example, the capacitance of the varactor is approximately 20% (or less) of the capacitance of variable capacitor 32. Preferably, the values of the switched capacitors are selected in light of the capacitance of the varactor to allow for continuous tunability of the resonator 20.

By the chain rule $$\frac{d\phi}{dV_b} = \frac{d\phi}{d\omega_o}\frac{d\omega_o}{d\Delta C}\frac{d\Delta C}{dV_b}$$

The variance of the phase is given as $$\text{var}(\phi) = \left(\frac{d\phi}{dV_b}\right)^2 \text{var}(V_b)$$

As $$\omega_o \approx k\frac{1}{\sqrt{C_o}}$$

and $$\frac{d\omega_o}{d\Delta C} \approx -k\frac{1}{\sqrt{C_o}}\frac{1}{2C_o} \approx -\omega_o\frac{1}{2C_o}$$

Now the shape of the phase curve with frequency is approximately invariant to small changes in $\omega_0$. Hence $$\frac{d\phi}{d\omega_o} = \frac{1}{D\omega_o} = \frac{2Q}{\omega_o}$$

The third factor of the variance equation is the capacitance $$\frac{d\Delta C}{dV_b} = rC_o$$

where r is defined as the normalized slope of the varactor capacitance as a function of the varactor bias voltage, evaluated at the nominal capacitance of $C_o$ corresponding to the middle of the tuning range.

Impact of Phase Noise on Resonator Q Versus Varactor Capacitance Bias Voltage Putting the above relationships together:

$$\frac{d\phi}{dV_b} = \left(\frac{2Q}{\omega_o}\right)\left(-\omega_o\frac{1}{2C_o}\right)rC_o$$

which simplifies to:

$$\text{var}(\phi)=Q^2r^2\,\text{var}(V_b)$$

Note that there are two independent terms in this phase variance:

1. $Q^2r^2$ which shows a clear relation between the phase variance relationship to the resonator Q and the varactor slope r evaluated at the operating bias voltage range; and 2. $\text{var}(V_b)$ which denotes the variance of the bias voltage resulting from the electronics, shown for example in FIG. 2b, which both sources and buffers this varactor bias voltage. This variance is driven in large part by the desired speed of the bias voltage change, with a faster switching speed requiring a larger bandwidth. As the bias voltage is spectrally uncorrelated, then each infinitesimal frequency band of the bias voltage contributes a statistically independent addition to the phase noise of the RF filter. A convenient bandwidth of 1 Hz may be arbitrarily selected such that $\text{var}(V_b)$ corresponds to the variance of the bias voltage source in a 1 Hz band. Hence a larger bandwidth for a faster switching time results in increased phase noise.

As the location of this $\text{var}(V_b)$ band in terms of center frequency maps directly into the frequency band of the phase noise, and that the phase noise is assumed to be small enough that linear superposition may be applied, then the single sideband phase noise power spectral density may be inferred directly from this relation as $$\mathcal{L}_{(\Delta\omega)}=Q^2r^2S_{Vb}(\Delta\omega)$$

where $\mathcal{L}(\Delta\omega)$ is the single sideband phase noise density per 1 Hz bandwidth at an offset frequency of $\Delta\omega$, driven from $\omega_0$ by a variation in the varactor bias voltage, and $S_{Vb}(\Delta\omega)$ is the power spectral density referenced to a 1 Hz bandwidth at an offset frequency of $\Delta\omega$ from $\omega_0$.

Reduction of Varactor Based Phase Noise

As discussed previously, the phase noise originating at the varactor is related to the sensitivity of the variable capacitor to the bias voltage, and the bandwidth of the bias voltage circuit. Since the bandwidth of the 2-port bias circuit of FIG. 2b is driven by the switching speed, if the switching speed of the RF filter does not have to be too fast, the bandwidth of the bias circuit shown in FIG. 2b may be reduced. This will imply that the phase noise at offset frequencies higher than the bandwidth of the varactor bias will be limited by the gain block NF.

The contribution of the varactor bias to phase noise was given as $$\text{var}(\phi)=Q^2r^2\,\text{var}(V_b)$$

which is dependent on Q, which, for small changes in varactor bias voltage will be constant to first order, and the factor r. If the varactor tuning range is reduced, then r is reduced proportionally which decreases the $\mathcal{L}(\omega)$ component from the varactor bias.

The key observation is that the phase noise power spectral density $\mathcal{L}(\Delta\omega)$ changes in proportion to $Q^2r^2$. Typically, there is a circuit design constraint imposed for the maximum level of $\mathcal{L}(\Delta\omega)$ for a given application. Also, the varactor diode is selected such that the resonator tank will have a set tuning range which fixes the "r" parameter. Therefore $Q^2r^2$ is limited, and hence so is the Q of the resonator. However, the benefit of the RF filter is that Q may be increased arbitrarily for the purpose of synthesizing narrow bandwidth RF filters. Hence for a given constraint of the phase noise power density, there is consequently a limit to how narrow the RF filter passband may be made.

To achieve a narrower filter bandwidth, Q must increase without violating the maximum of $Q^2r^2$ set by the allowable phase noise limit. Hence to increase Q, r must have to decrease. Unfortunately, decreasing r by desensitizing the sensitivity of the varactor tuning, implies a lower frequency tuning range of the RF filter as the change in bias voltage is generally limited. Reducing the tuning range of the RF filter is detrimental to typical applications of the RF filter.

Instead of decreasing the tuning range, r may still be effectively reduced by adding in several stages of switched capacitors to cover the reduction in varactor capacitance range without sacrificing overall tuning range. Referring to FIG. 5, with switched capacitors 40 switched out of resonator 20, assume the range of capacitance of the varactor is R. Then with one capacitor 40 switched in, such that M=1, the range of capacitance is 2R, with M=2 it is 4R and so forth. Hence with a required capacitance range to get the tuning range, and with M such capacitors, the relative range of the varactor is then $2^{-M}$ of the total capacitance tuning range.

Incorporating the number of switched capacitors, M, the modified relation for the phase variance becomes $$\mathcal{L}(\Delta\omega) = Q^2\left(\frac{r}{2^M}\right)^2 S_{Vb}(\Delta\omega)$$

Figure 6:
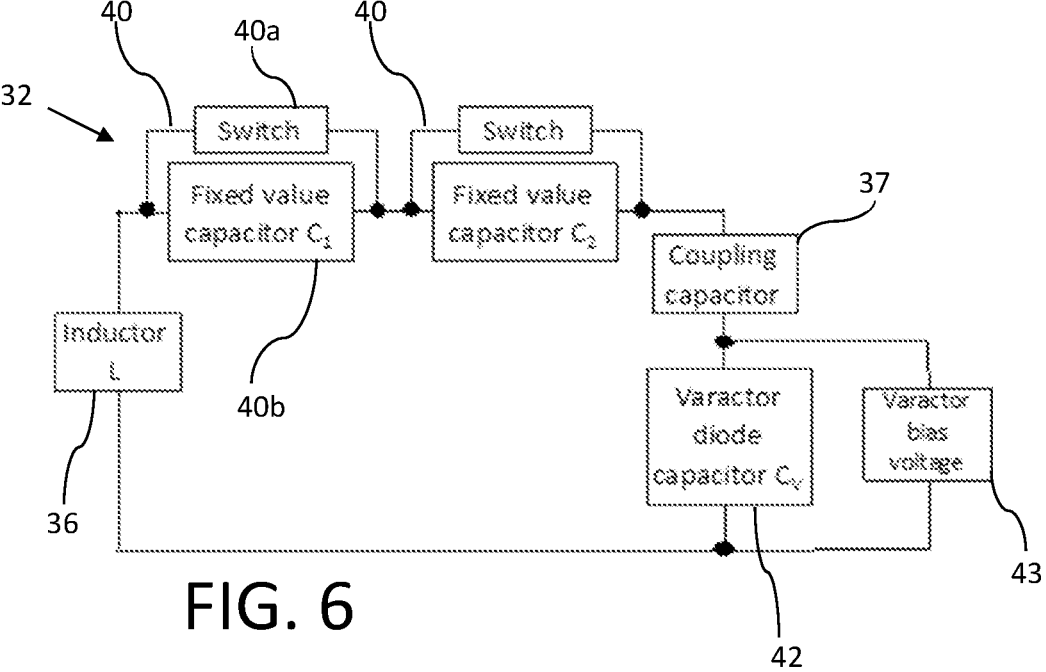
FIG. 6 is a block diagram of a resonator with two switched capacitor elements in series and M=2.

Hence, $\mathcal{L}(\omega)$ is then reduced by 20 $\log(2^M)$ dBc which allows the Q to be increased by the same factor of $2^M$. FIG. 5 shows an example implementation of resonant tank 32 or 34 with two switched capacitors 40 arranged in parallel. FIG. 6 is the same resonator 20 with switched capacitors 40 in series. Clearly there are many possible combinations.

From the above formula, the following operating factor may be derived:

$$Qr\sqrt{\frac{S_{Vb}(\Delta\omega)}{\mathcal{L}(\Delta\omega')}}$$

which may be useful in designing a resonant circuit with a desired level of phase noise control. In particular, this operating factor may be used as an indication of the number M of switched capacitors that would be required to achieve a desired level of phase noise control.

Graphical Depiction of Implementing Low Phase Noise Operation

Referring to FIGS. 7a and 7b, the concept and implementation will now be considered. FIG. 7a shows the initial state where the system response is tuned for $\omega_0$. It is seen that the phase noise at $\omega_0$ is above the maximum allowable $\mathcal{L}(\omega)$ at $\omega_0$. At a frequency $\Delta\omega$ above (or below) $\omega_0$, the phase noise at $\mathcal{L}(\omega+\Delta\omega)$ is well below the maximum allowable $\mathcal{L}(\omega)$. This is due to the reduced phase noise when the varactor bias voltage has changed, resulting in the offset $\Delta\omega$ indicated. It may be desirable to keep that bias voltage phase noise contribution, but this would be at a varactor capacitance value that would shift the operating frequency.

Therefore, a fixed capacitance value may be switched in or out to move the operating frequency back to $\omega_0$ to offset the change in varactor capacitance that resulted in the reduced phase noise. This is shown in FIG. 7b, where the original operating frequency of the filter has been restored, while the varactor bias phase noise remains below the maximum allowable $\mathcal{L}(\omega)$.

Examples of Phase Noise Reduction of the Varactor

As an example, consider r=0.4/5 and M=1, which accounts for an 8% capacitance change based on a 5 pF varactor range over 5 volts bias. Then $$\mathrm{var}(\emptyset)=(0.08Q)^2\,\mathrm{var}(V_b)$$

And for a Q=1000:

$$\mathrm{var}(\emptyset)=6400\,\mathrm{var}(V_b)$$

Consider the phase noise of a common buffer which is about 2 nV/$\sqrt{\mathrm{Hz}}$. This is a broad bandwidth phase noise that extends out to the cutoff frequency of the bias circuitry shown in FIG. 2.

The single sideband phase noise of $\mathcal{L}(\omega)$ is then given as:

$$\mathcal{L}(\omega) = 10\log(6400) + 20\log(2\cdot10^{-9}) = -136\left(\frac{dBc}{Hz}\right)$$

Now consider the case where the tuning range remains at 20%, but now r=0.2/5 as an additional switchable fixed capacitor is used for M=2, with values chosen to provide the overall 20% tuning range, but with the varactor only using 2.5 capacitance units out of a total of 5 capacitance units of tuning. Looking at a typical varactor characteristic of FIG. 2, it appears that a further reduction in r is possible by using the upper end of the varactor bias voltage. This will be ignored in this example but may be part of an overall resonator design.

This gives the following relation:

$$\mathrm{var}(\emptyset)=(0.04Q)^2\,\mathrm{var}(V_b)$$

And for a Q=1000:

$$\mathrm{var}(\emptyset)=1600\,\mathrm{var}(V_b)$$

Using the same value for buffer phase noise as above, the single sideband phase noise of $\mathcal{L}(\omega)$ is then given as:

$$\mathcal{L}(\omega) = 10\log(1600) + 20\log(2\cdot10^{-9}) = -142\left(\frac{dBc}{Hz}\right)$$

This shows a 6 dB reduction in the single sideband phase noise with no reduction in overall tuning range, as switched fixed capacitors are added to the circuit of FIG. 5 or 6.

When the value of M is increased to 3, as an extension of FIG. 5 or 6, the single sideband phase noise, again for Q=1000, becomes:

$$\mathrm{var}(\emptyset)=(0.01Q)^2\,\mathrm{var}(V_b)$$

$$\mathrm{var}(\emptyset)=100\,\mathrm{var}(V_b)$$

and $$\mathcal{L}(\omega) = 10\log(400) + 20\log(2\cdot10^{-9}) = -148\left(\frac{dBc}{Hz}\right)$$

Consequently, by reducing the tuning range for a value of r=0.2/5 and increasing to M=2, the single sideband phase noise may be reduced by a total of 6 dB below the r=0.4/5 case. The resulting phase noise versus the number of switchable fixed capacitors M is shown in FIG. 8, indicating that the phase noise may be significantly reduced.

By carefully choosing the fixed capacitor section values, for desired values of M, the 20% tuning range of the original case may be recovered. The phase noise generated by the varactor diode is significant and may be reduced as shown in FIG. 8 with multiple switched fixed capacitor sections, each of which reduces the tuning range of the varactor, but the overall tunable capacitance remains the same by virtue of the switched capacitor bank(s).

An important consideration at system level is the switching speed of the various fixed capacitor banks. Implementable switching circuits may have switching speeds on the order of ≤10 nsec.

The discussion above is applicable to designing a circuit to operate with certain constraints. In particular, the following relationship:

$$\mathcal{L}(\Delta\omega) \approx Q^2\left(\frac{r}{2^M}\right)^2 S_{Vb}(\Delta\omega)$$

may be solved for M as follows:

$$M \approx \frac{1}{2}\log_2\left(Q^2r^2\frac{S_{Vb}(\Delta\omega)}{\mathcal{L}(\Delta\omega)}\right)$$

As such, it is possible to calculate the number of capacitance stages required given certain operating parameters and design constraints. It will be understood that this is a general relationship and may be expressed in alternate forms or refined by those skilled in the art to fit the various circumstances under which it may be used, which may include refinements such as the behaviour of the particular components being used, or observed results.

Multipole Filtering

Higher bandwidth may be achieved using a multipole filter realized by cascading several RF filters. In this example, each RF filter may have separate and independent varactor bias and gain blocks. As such, the phase noise contributed by each RF filter will be statistically independent. Hence if there are n filter blocks then 10 log(n) dB will need to be added to $\mathcal{L}(\omega)$. For example, a 4 pole filter this would add 6 dB to the r=0.4/5 and M=1 case above, bringing $\mathcal{L}(\omega)$ up to −130dBc/Hz.

As discussed above, phase noise in a variable active feedback RF filter may be reduced by using bank(s) of switched capacitors 40 with fixed value capacitor elements combined with a tunable capacitor element 42, such as a varactor, with appropriate design trade-offs to achieve a suitable tuning range of the resonator. The accumulation of phase noise from multiple RF filter components configured as a multipole filter may also be considered.

Further, as discussed above, the key system component of phase noise is related to the term $(Qr)^2$, where Q describes the bandwidth of the resonator and r is a measure of the change in the normalized varactor capacitance versus varactor bias voltage with respect to the tuning control. Phase noise may be reduced by a factor of $2^M$ where M is the number of fixed capacitors in the switched capacitor bank.

In addition to using switched fixed capacitor 42 bank(s) to reduce the phase noise component of the circuit, the switched capacitor 42 banks may also be used to extend the tuning range of the RF filter, or to allow for a higher Q enhancement consistent with the term $(Qr)^2$. In a practical realization, the added complexity of increasing M may be balanced against the need for lower phase noise, higher Q and higher tuning range.

Variable RF Oscillator Overview

The discussion above with respect to phase FIG. reduction in an RF resonator was developed in the context of an active feedback tunable RF filter. Similar considerations also apply to an active feedback tunable RF oscillator operating in the right half of the complex s plane. In analogous fashion, following the above development, the phase noise of a tunable RF oscillator may be reduced by deploying switched capacitor banks as the main frequency changing element, with tunable capacitors being used for fine tuning the oscillation frequency.

An oscillator may have a higher Q when implemented with a multipole architecture, as described above. As such, the oscillator will have a lower phase noise.

Further, as discussed above, the key system component of oscillator phase noise is related to the term $(Qr)^2$, where Q describes the bandwidth of the oscillator and r is a measure of the change in the normalized varactor capacitance versus varactor bias voltage with respect to the oscillator tuning control. Oscillator phase noise may be reduced by a factor of $2^M$ where M is the number of fixed capacitors in the switched capacitor bank.

In this patent document, the word "comprising" is used in its non-limiting sense to mean that items following the word are included, but items not specifically mentioned are not excluded. A reference to an element by the indefinite article "a" does not exclude the possibility that more than one of the elements is present, unless the context clearly requires that there be one and only one of the elements.

The scope of the following claims should not be limited by the preferred embodiments set forth in the examples above and in the drawings, but should be given the broadest interpretation consistent with the description as a whole.

What is claimed is:

1. An active feedback RF resonator, comprising:
a signal loop having a signal input and a signal output, the signal loop comprising a variable gain stage and at least one variable resonator, each variable resonator comprising an inductance element and a variable capacitance element comprising a plurality of switched fixed value capacitors and a variable capacitor; and
a controller programmed to operate each of the plurality of switched fixed value capacitors and the variable capacitor, the variable capacitance element being operated within an operating range that is less than a maximum tunable range of the variable capacitor such that a phase noise of an active feedback RF signal is maintained below a maximum value.

2. The active feedback RF resonator of claim 1, wherein the phase noise is described by a relationship:

$$\mathcal{L}(\Delta\omega) \approx Q^2 \left(\frac{r}{2^M}\right)^2 S_{Vb}(\Delta\omega)$$

where $\Delta_\omega$ is a frequency offset from the operating frequency $\omega_0$, $\mathcal{L}(\Delta_\omega)$ is the phase noise at $\Delta_\omega$, Q is an operating Q of the variable resonator, r is a normalized rate of change of variable capacitance relative to an operating bias voltage of the variable capacitor, M is the number of switched fixed value capacitors, and $S_{vb}(\Delta_\omega)$ is a power spectral density of the phase noise at the operating frequency plus $\Delta_\omega$.

3. The active feedback RF resonator of claim 1, wherein the variable capacitor is a varactor.

4. The active feedback RF resonator of claim 1, operating as an RF filter or an RF oscillator.

5. A method of designing an active feedback RF resonator, comprising the steps of:
providing a signal loop having a signal input and a signal output, the signal loop comprising a variable gain stage and at least one variable resonator, each variable resonator comprising an inductance element and a variable capacitance element comprising a number of switched capacitors and a variable capacitor, the switched capacitors having fixed capacitance values; and
for each variable resonator:
calculating an operating factor based on one or more of the following parameters of the variable resonator: a minimum Q, a maximum phase noise factor, a range of operating frequencies, and an operating bias voltage and capacitance of the variable capacitor; and;
calculating the number of switched capacitors based on a logarithm of the operating factor.

6. The method of claim 5, wherein the operating factor is proportional to $$Qr\sqrt{\frac{S_{Vb}(\Delta\omega)}{\mathcal{L}(\Delta\omega)}},$$

where $(\Delta_\omega)$ is a frequency offset from the operating frequency, $\mathcal{L}(\Delta_\omega)$ is the phase noise at $\Delta_\omega$, Q is an operating Q of the variable resonator, r is a normalized rate of change of capacitance relative to a change in the operating bias voltage of the variable capacitor, and $S_{vb}$ ($\Delta_\omega$) is a power spectral density of the phase noise at $\Delta_\omega$.

7. The method of claim 5, wherein the variable capacitor is a varactor.

8. The method of claim 5, wherein the active feedback RF resonator is operated as an RF filter or an RF oscillator.

9. An active feedback RF resonator, comprising:
a signal loop having a signal input and a signal output, the signal loop comprising a variable gain stage and at least one variable resonator, each variable resonator comprising an inductance element and a variable capacitance element comprising a number of switched capacitors and a variable capacitor, the switched capacitors having fixed capacitance values, and wherein the variable capacitor comprises 40% or less of a total capacitance of the variable capacitance element.

10. The active feedback RF resonator of claim 9, wherein the variable capacitor comprises 20% or less of the total capacitance of the variable capacitance element.

11. The active feedback RF resonator of claim 9, wherein the variable capacitor is a varactor.

12. The active feedback RF resonator of claim 9, wherein the phase noise is described by a relationship:

$$\mathcal{L}(\Delta\omega) \approx Q^2 \left( \frac{r}{2^M} \right)^2 S_{Vb}(\Delta\omega)$$

where $\Delta_\omega$ is a frequency offset from the operating frequency $\omega_0$, $\mathcal{L}$ ($\Delta_\omega$) is the phase noise at $\Delta_\omega$, Q is an operating Q of the variable resonator, r is a normalized rate of change of variable capacitance relative to an operating bias voltage of the variable capacitor, M is the number of switched fixed value capacitors, and $S_{vb}$ ($\Delta_\omega$) is a power spectral density of the phase noise at the operating frequency plus $\Delta_\omega$.

* * * * *